(12) United States Patent
Park

(10) Patent No.: US 7,049,533 B2
(45) Date of Patent: May 23, 2006

(54) HOOD SWITCH FOR A FRONT END MODULE CARRIER

(75) Inventor: Dae-sung Park, Seongnam-shi (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 10/810,575

(22) Filed: Mar. 29, 2004

(65) Prior Publication Data

US 2005/0133350 A1    Jun. 23, 2005

(30) Foreign Application Priority Data

Dec. 18, 2003   (KR) .................. 10-2003-0092949

(51) Int. Cl.
*H01H 3/16*   (2006.01)

(52) U.S. Cl. ............ 200/61.62; 200/61.7; 335/205

(58) Field of Classification Search ......... 200/61.58 R, 200/61.7–61.73; 335/205–207
See application file for complete search history.

(56) References Cited

U.S. PATENT DOCUMENTS

| | | | | |
|---|---|---|---|---|
| 3,896,404 A | * | 7/1975 | Peterson | 335/205 |
| 4,210,888 A | * | 7/1980 | Holce | 335/207 |
| 4,210,889 A | * | 7/1980 | Holce | 335/207 |
| 4,702,094 A | | 10/1987 | Peterson | |
| 4,999,599 A | * | 3/1991 | Spier | 335/207 |
| 5,325,078 A | * | 6/1994 | Carothers | 335/205 |
| 5,412,361 A | * | 5/1995 | Combest et al. | 335/205 |
| 5,668,533 A | * | 9/1997 | Jackson et al. | 340/547 |
| 6,060,969 A | * | 5/2000 | Hufgard et al. | 335/207 |

* cited by examiner

*Primary Examiner*—Michael A. Friedhofer
(74) *Attorney, Agent, or Firm*—Greenblum & Bernstein, P.L.C.

(57) ABSTRACT

Disclosed is a hood switch of a front end module carrier, which employs a contactless-type proximity switch installed on an inner panel of a hood in order to inform the driver of an opened state of the hood installed on the front end module carrier in a vehicle, thus improving aesthetic appearance and durability.

4 Claims, 1 Drawing Sheet

HOOD SWITCH FOR A FRONT END MODULE CARRIER

RELATED APPLICATION

The present disclosure relates to subject matter contained in Korean application No. 2003-92949, filed on Dec. 18, 2003, which is herein expressly incorporated by reference its entirety.

BACKGROUND OF THE INVENTION

1. Field of the Invention

The present invention relates to a hood switch of a front end module carrier, and more particularly to a hood switch of a front end module carrier, which employs a contactless-type proximity switch installed on the inner panel of a hood in order to inform a driver of an opened state of the hood installed on the front end module carrier of a vehicle, thus improving aesthetic appearance and durability.

2. Description of the Related Art

As well known to those skilled in the art, a front end module carrier of a vehicle accommodates components, such as the engine, radiator, tram ion gear box, etc, installed therein, and a hood panel for protecting the above components is provided on an upper surface of the front end module carrier.

The hood panel includes an outer hood panel, and an inner hood panel, which are welded together. The outer hood panel obtains a sufficient strength by press finishing and thermal treating steps. The inner hood panel is located in the outer hood panel, and serves to increase its strength. The hood panel is hinged to a vehicle frame, and opened and closed to inspect whether or not the components mounted in the front-end module carrier are in a normal state or to repair the components.

Further, a contact-type hood opening switch is provided on the hood panel, thus informing a driver of an opened state of the hood panel. When the hood panel is opened, the contact-type hood opening switch operates and turns on an alarm light on the instrument panel, thus informing the driver of the opening of the hood panel. On the other hand, when the hood panel is closed, the inner hood panel presses the contact-type hood-opening switch and the contact-type hold opening switch turns off the alarm light on the instrument panel.

Since such a contact-type hood-opening switch is provided with a protruding structure formed on the outer surface thereof in order to sense the state of the hood panel, the protruded structure of the contact-type hood-opening switch deteriorates the aesthetic appearance and limits the installation position of the contact-type hood-opening switch during design.

Further, the contact-type hood-opening switch requires an additionally-processed hole, thus causing corrosion around the hole and causing poor durability.

SUMMARY OF THE INVENTION

Therefore, the present invention has been made in view of the above problems, and it is an object of the present invention to provide a hood switch of a front end module carrier, which employs a contactless-type proximity switch installed on an inner panel of a hood in order to inform a driver of an opened state of the hood installed on a front end module carrier of a vehicle, thus improving aesthetic appearance and durability.

In accordance with the present invention, the above and other objects can be accomplished by the provision of a hood switch of a front end module carrier comprising: a conductor element attached to a designated position of a lower surface of the front end module carrier, and a magnetic element attached to a designated position of an inner panel of a hood provided above the front end module carrier.

Preferably, the conductor element and the magnetic element may be installed such that they are opposite to each other when the hood panel is closed.

When the hood of the vehicle is closed so that the magnetic element attached to the lower surface of the hood inner panel is close to the conductor element attached to the lower surface of the front end module carrier, the switch is shut off and the alarming light on the instrument panel in the vehicle is turned off. On the other hand, when the hood of the vehicle is opened so that the magnetic element attached to the lower surface of the hood inner panel is separated from the conductor element attached to the lower surface of the front end module carrier, the switch is turned on and the alarm light on the instrument panel of the vehicle is turned on.

Further, the hood switch of the front end module carrier employs a contactless-type proximity switch rather than a conventional contact-type switch, thereby improving aesthetic appearance and durability.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
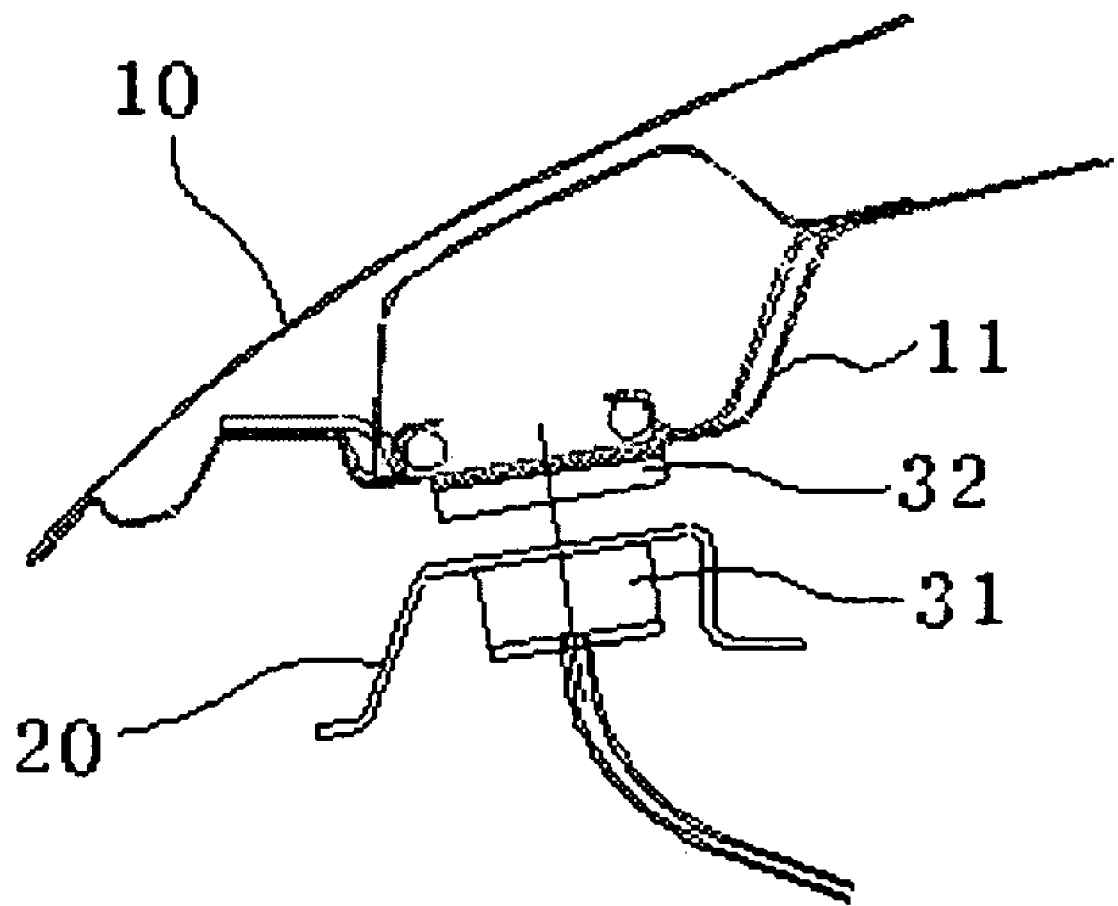
FIG. 1 is a schematic view illustrating an installation structure of a hood switch of a front end module carrier in accordance with the present invention.

Now, a preferred embodiment of the present invention will be described in detail with reference to the annexed drawings.

FIG. 1 is a schematic view illustrating an installation structure of a hood switch of a front end module carrier in accordance with the present invention.

As shown in FIG. 1, the hood switch of the front end module carrier in accordance with the present invention is a contactless-type proximity switch, and comprises a conductor element 31 installed at a designated position of a lower surface of the front end module carrier 20 for mounting components of a vehicle thereon, and a magnetic element 32 installed at a designated position of an inner panel 11 of a hood panel 10 provided above the front end module carrier 20.

Particularly, the conductor element 31 and the magnetic element 32 are installed such that they are opposite each other when the hood panel 10 is closed.

That is, the hood panel 10 provided above the front end module carrier 20 for mounting the components of the vehicle thereon which is hinged to a vehicle frame. The conductor element 31 and the magnetic element 32 are installed such that they are opposite each other when the hood panel 10 is opened and closed to inspect whether or not components (not shown) mounted on the front end module carrier 20 are in a normal state or to repair the components.

The hood switch is a contactless-type proximity switch, as described above, and is semi-permanent in life span, thus being extensively applied in factory automation systems.

The proximity switch is a direct current (DC) output proximity switch, and is divided into two types, a PNP type and an NPN type. The proximity switch is used to switch on/off direct current driving load of a power relay, a solenoid, an electronic counter, etc.

Further, a magnetic proximity switch includes a magnet element and a conductor element The conductor element includes two leads made of a magnetic alloy, and the magnet element includes a permanent magnet. The two leads exhibit opposite magnetic poles and attract each other when an external magnetic field is generated in the conductor element.

Here, an at on force causes snap action to a micro switch adjacent to the leads, thus closing a contact point On the other hand, when the magnet and conductor elements are separate, a contact point of a lead switch is opened, thus allowing for the presence of an object to be detected in a contactless manner.

As described above, when the hood panel 10, which is provided above the front end module carrier 20 and hinged to the vehicle flame, is opened and closed to inspect whether or not the components (not shown) mounted on the front end module carrier 20 are in a normal state or to repair the components, the switch is turned on or off by the operations of the magnetic element 32 attached to the lower surface of the hood inner panel 11 and the conductor element 31 attached to the lower surface of the front end module carrier 20, thereby allowing an alarm light on an instrument panel in a vehicle to be turned on or off.

More specifically, when the hood of the vehicle is closed so that the magnetic element 32 attached to the lower surface of the hood inner panel 11 is close to the conductor element 31 attached to the lower surface of the front end module carrier 20, the switch is shut off and the alarming light on the instrument panel in the vehicle is turned off On the other hand, when the hood of the vehicle is opened so that the magnetic element 32 attached to the lower surface of the hood inner panel 11 is distant from the conductor element 31 attached to the lower surface of the front end module carrier 20, the switch is turned on and the alarm light on the instrument panel in the vehicle is turned on.

As apparent from the above description, the present invention provides a hood switch of a front end module carrier, which employs a contactless-type proximity switch rather than a conventional contact-type switch, thus improving aesthetic appearance and durability.

Further, the hood switch does not require an additionally-processed hole, thus being easily designed such that it is installed on the front end module carrier.

Moreover, the hood switch does not require the additionally-processed hole used for installing the switch, thus eliminating problems caused by corrosion of the hole and improving stiffness/hardness of the front end module carrier.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A hood switch in combination with a front end module carrier comprising:
    a conductor element attached to a designated position of a lower surface of the front end module carrier;
    a magnetic element attached to a designated position of an inner panel of a hood provided above the front end module carrier,
    wherein said magnetic element is positioned on an external surface of the inner panel without being embedded in the inner panel.

2. The hood switch as set forth in claim 1,
    wherein the conductor element and the magnetic element are installed such that they are opposite each other when the hood panel is closed.

3. The hood switch as set forth in claim 1,
    wherein the hood switch is a contactless-type proximity switch.

4. The hood switch as set forth in claim 3,
    wherein an alarm light on an instrument panel of a vehicle is connected to either the conductor element or the magnetic element, and the alarm light is illuminated when the hood is opened.

* * * * *